(12) United States Patent
Asami et al.

(10) Patent No.: US 9,891,848 B2
(45) Date of Patent: Feb. 13, 2018

(54) MEMORY SYSTEM AND METHOD FOR CONTROLLING NONVOLATILE MEMORY

(71) Applicant: TOSHIBA MEMORY CORPORATION, Minato-ku (JP)

(72) Inventors: Shohei Asami, Yokohama (JP); Tokumasa Hara, Kawasaki (JP); Hiroshi Yao, Yokohama (JP); Kenichiro Yoshii, Tokyo (JP); Riki Suzuki, Yokohama (JP); Toshikatsu Hida, Yokohama (JP); Osamu Torii, Tokyo (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 79 days.

(21) Appl. No.: 14/847,560

(22) Filed: Sep. 8, 2015

(65) Prior Publication Data
US 2016/0259576 A1  Sep. 8, 2016

Related U.S. Application Data

(60) Provisional application No. 62/128,012, filed on Mar. 4, 2015.

(51) Int. Cl.
*G06F 3/06* (2006.01)
*G11C 29/40* (2006.01)

(52) U.S. Cl.
CPC .......... *G06F 3/0619* (2013.01); *G06F 3/0634* (2013.01); *G06F 3/0644* (2013.01); *G06F 3/0659* (2013.01); *G06F 3/0679* (2013.01); *G11C 29/40* (2013.01); *G06F 2212/401* (2013.01)

(58) Field of Classification Search
None
See application file for complete search history.

(56) References Cited

U.S. PATENT DOCUMENTS

| 6,031,758 A | 2/2000 | Katayama et al. |
| 8,861,277 B1 * | 10/2014 | Rategh .................. G11C 29/76 365/185.18 |
| 8,885,426 B1 * | 11/2014 | Burstein ................ G11C 29/40 365/149 |
| 2002/0101777 A1 * | 8/2002 | Anand .................. G11C 29/802 365/225.7 |

(Continued)

FOREIGN PATENT DOCUMENTS

| JP | 3614173 | 1/2005 |
| JP | 2006-048777 | 2/2006 |

(Continued)

*Primary Examiner* — Edward Dudek, Jr.
*Assistant Examiner* — Ralph A Verderamo, III
(74) *Attorney, Agent, or Firm* — Oblon, McClelland, Maier & Neustadt, L.L.P.

(57) ABSTRACT

According to one embodiment, a nonvolatile memory system includes a memory including a first memory and a second memory, the first memory including memory strings, the memory strings including memory cell transistors connected in series; and a memory controller which compresses a failure string position information of the first memory, which stores the compressed failure string position information in the second memory, and which decompresses the compressed failure string position information stored in the second memory.

16 Claims, 13 Drawing Sheets

(56) References Cited

U.S. PATENT DOCUMENTS

| | | |
|---|---|---|
| 2004/0090831 A1 | 5/2004 | Im et al. |
| 2006/0067107 A1* | 3/2006 | Gerstmeier ............. G11C 7/20 |
| | | 365/149 |
| 2006/0171202 A1 | 8/2006 | Kawamoto et al. |
| 2009/0168523 A1 | 7/2009 | Shirakawa et al. |
| 2014/0075098 A1 | 3/2014 | Uno |

FOREIGN PATENT DOCUMENTS

| | | |
|---|---|---|
| JP | 2009-016037 | 1/2009 |
| JP | 2009-158018 | 7/2009 |
| JP | 2014-052899 | 3/2014 |

* cited by examiner

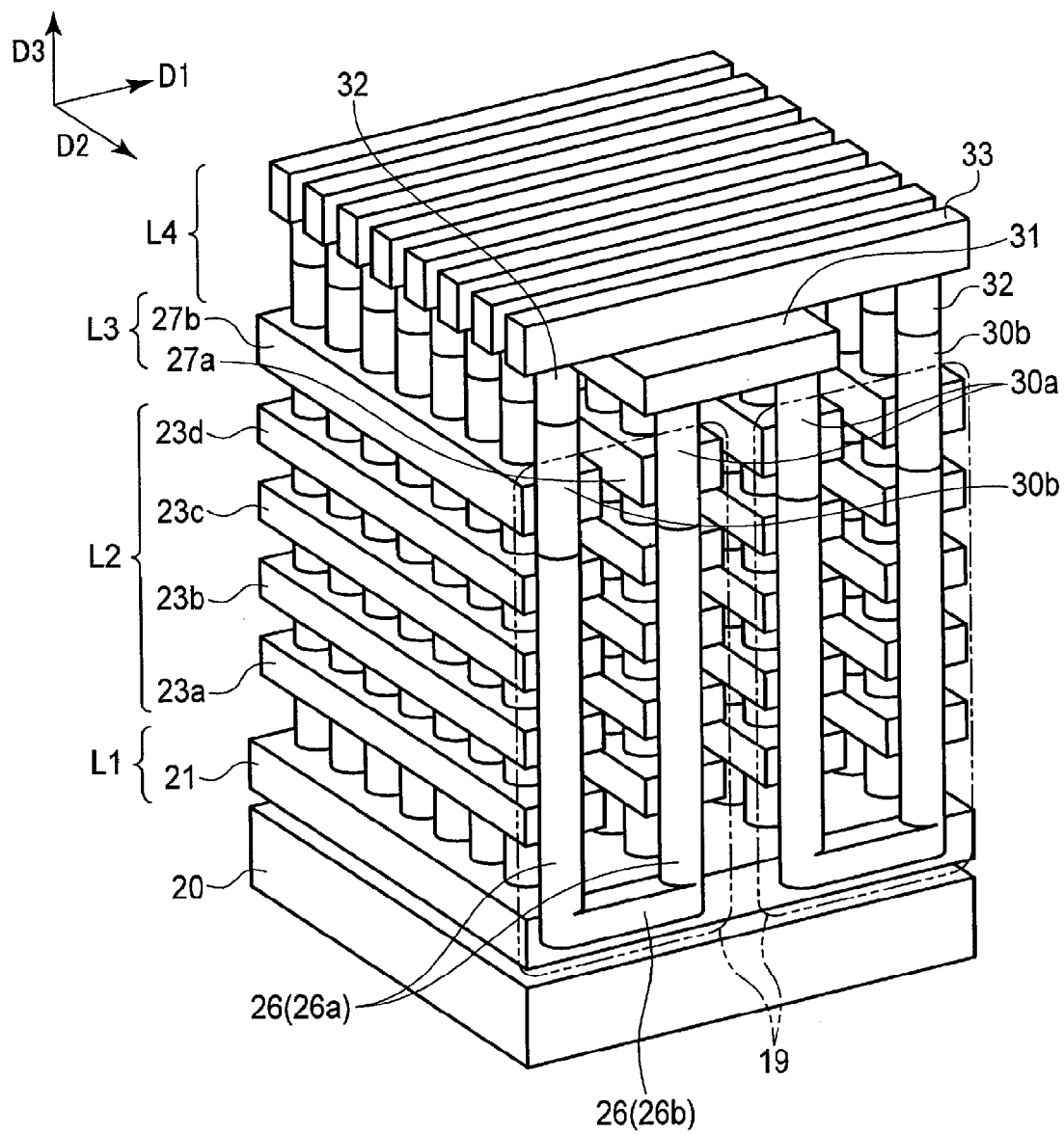
F I G. 4

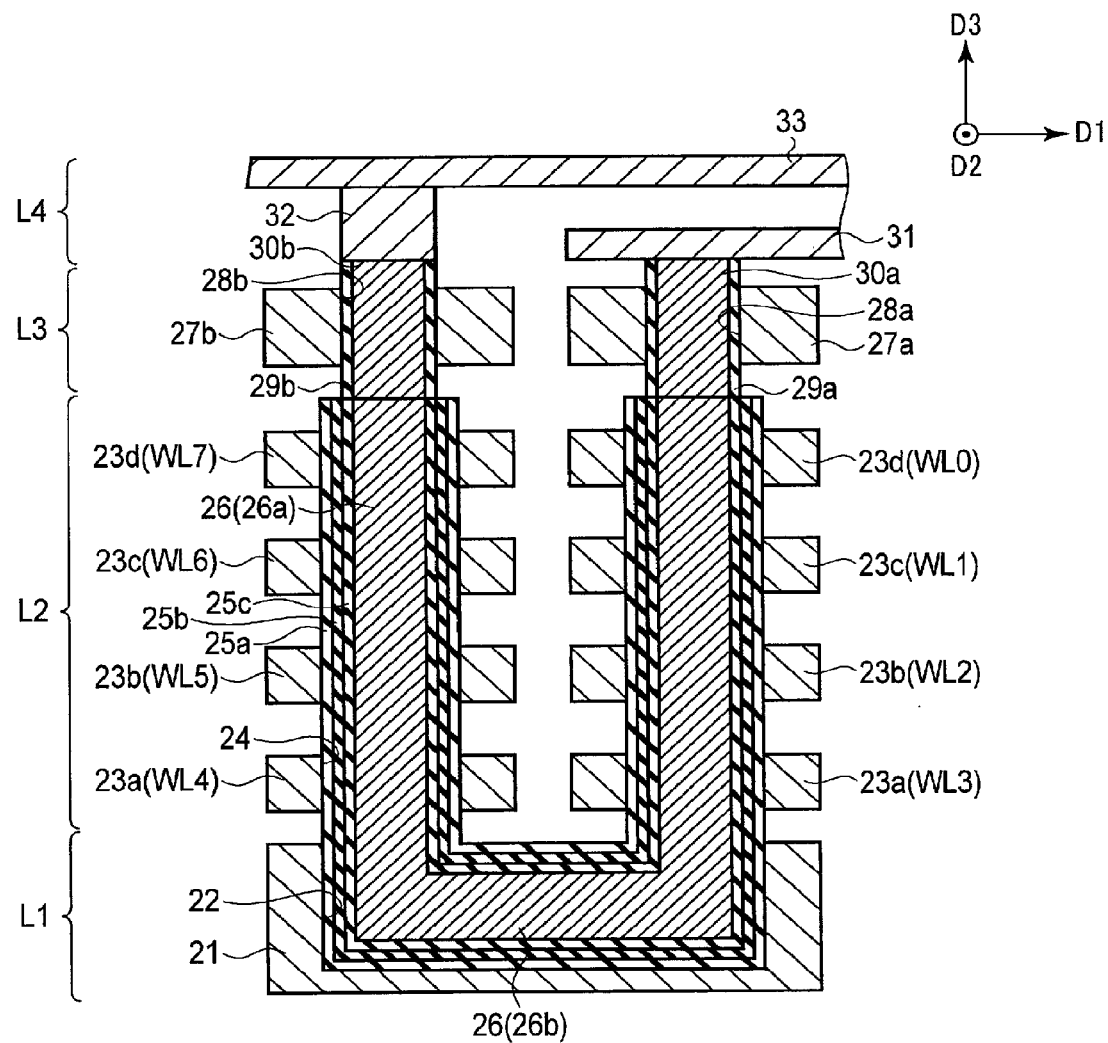
F I G. 5

Fixation failure STR position information table

| STR address | Defective or normal |
| --- | --- |
| BLK0,GP0,STR0 | Normal |
| BLK0,GP0,STR1 | Normal |
| BLK0,GP0,STR2 | Defective |
| BLK0,GP0,STR3 | Normal |
| BLK0,GP1,STR0 | Defective |
| BLK0,GP1,STR1 | Defective |
| BLK0,GP1,STR2 | Normal |
| BLK0,GP1,STR3 | Normal |

F I G. 6

Address association table

| PAGE address | STR address |
| --- | --- |
| BLK0,GP0,PAGE0 | BLK0,GP0,STR0_STR3 |
| BLK0,GP0,PAGE1 | BLK0,GP0,STR0_STR3 |
| BLK0,GP0,PAGE2 | BLK0,GP0,STR0_STR3 |
| BLK0,GP0,PAGE3 | BLK0,GP0,STR0_STR3 |
| BLK0,GP1,PAGE0 | BLK0,GP1,STR0_STR3 |
| BLK0,GP1,PAGE1 | BLK0,GP1,STR0_STR3 |
| BLK0,GP1,PAGE2 | BLK0,GP1,STR0_STR3 |
| BLK0,GP1,PAGE3 | BLK0,GP1,STR0_STR3 |

F I G. 7

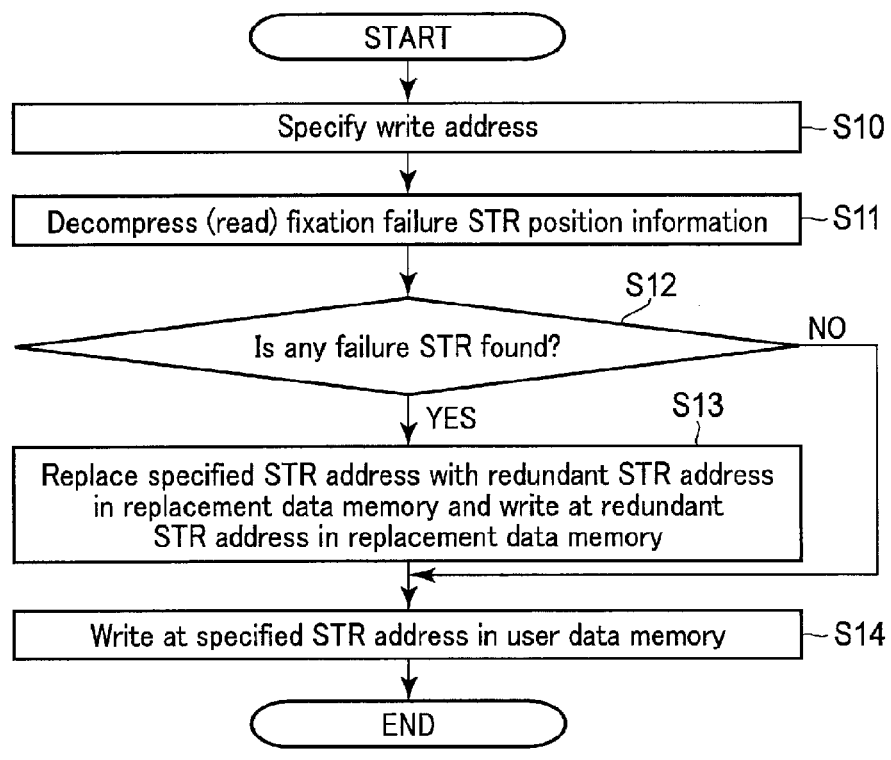
F I G. 8
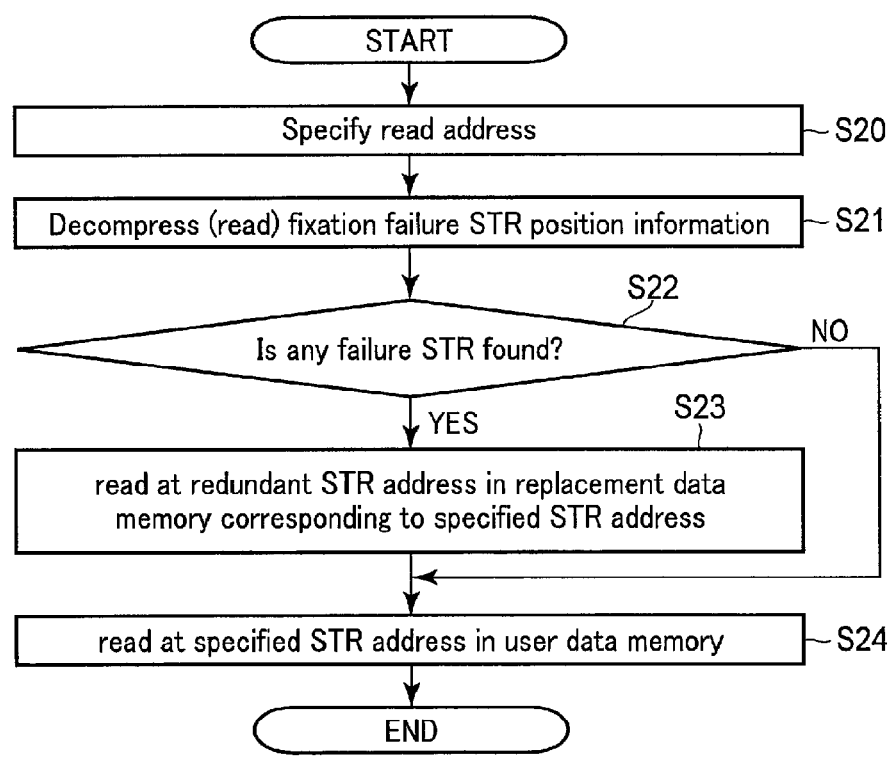
F I G. 9

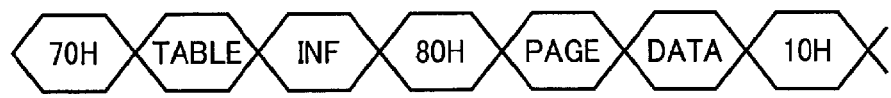
F I G. 10
F I G. 11

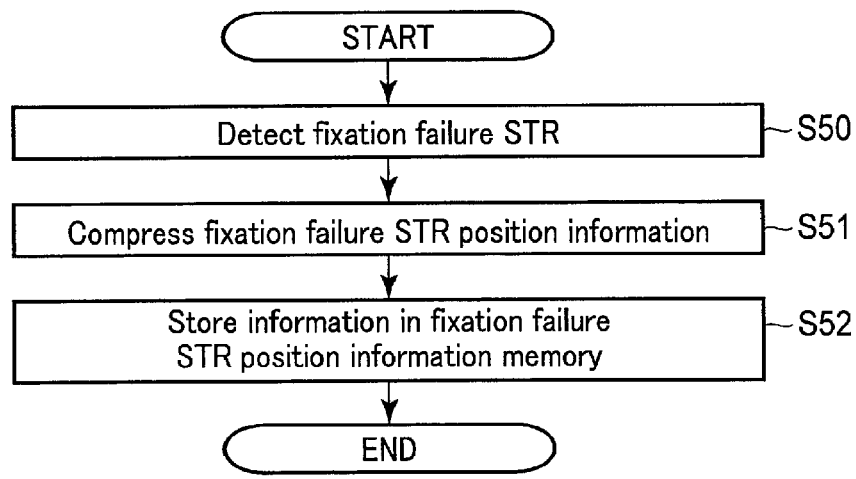
F I G. 15
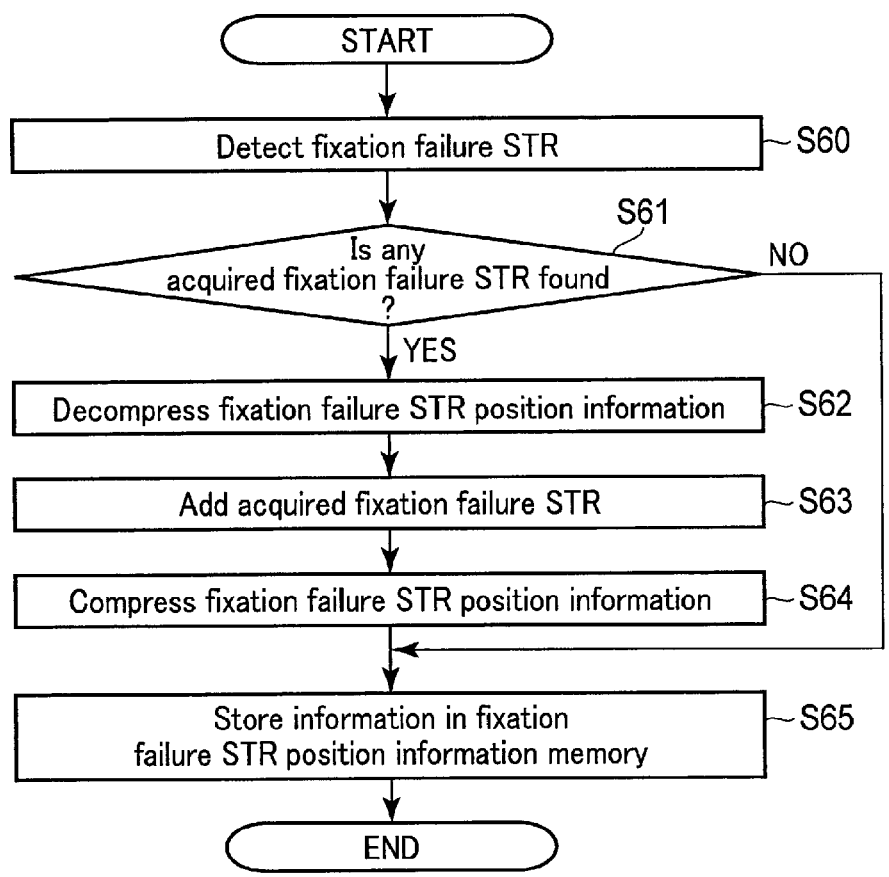
F I G. 16

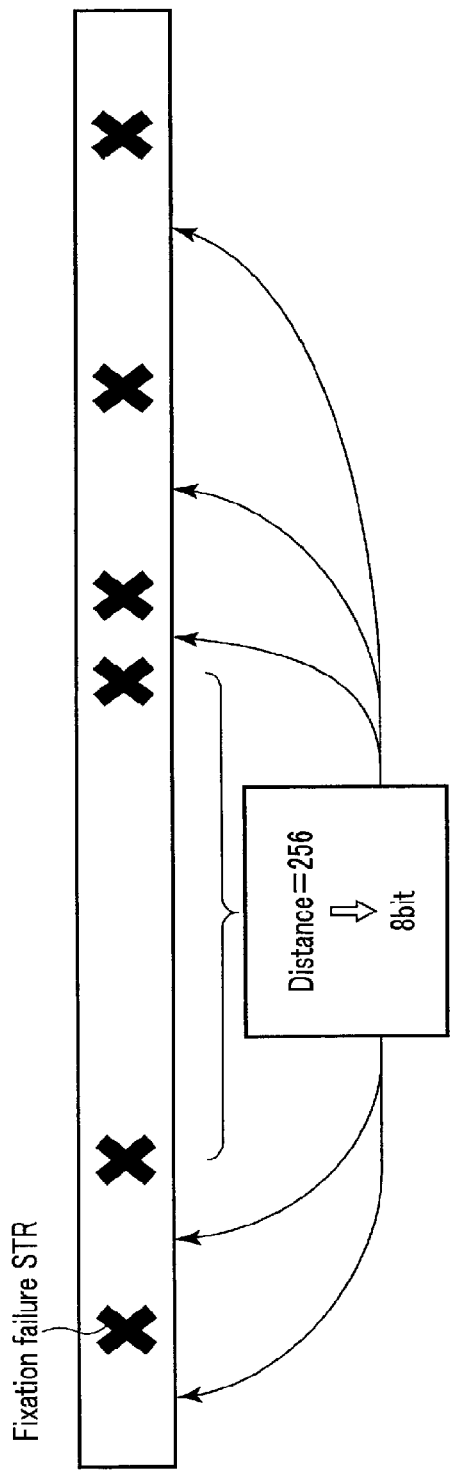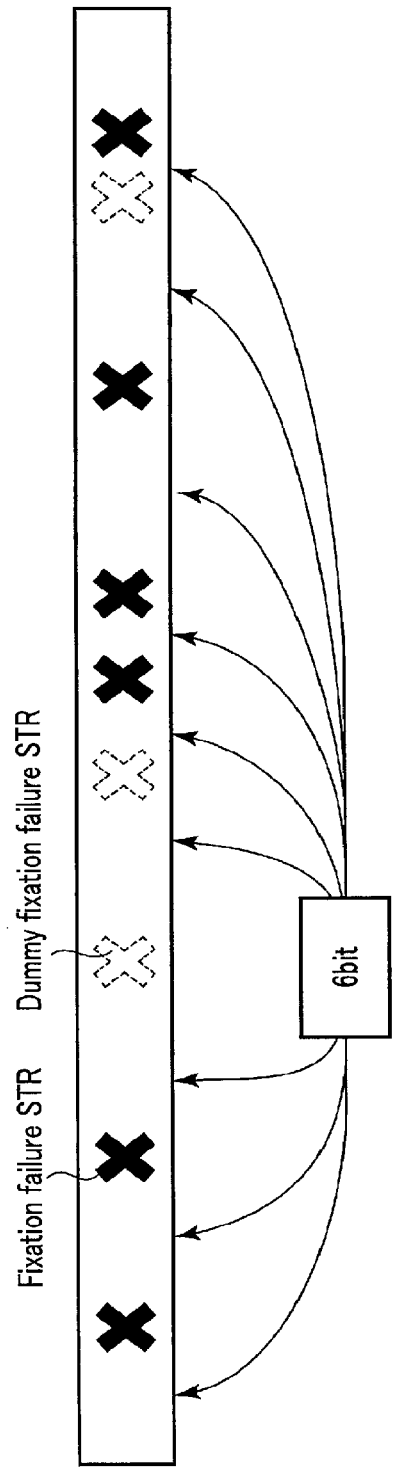

MEMORY SYSTEM AND METHOD FOR CONTROLLING NONVOLATILE MEMORY

CROSS REFERENCE TO RELATED APPLICATIONS

This application is based upon and claims the benefit of priority from U.S. Provisional Application No. 62/128,012, filed Mar. 4, 2015, the entire contents of all of which are incorporated herein by reference.

FIELD

Embodiments relates to a memory system and a method for controlling a nonvolatile memory

BACKGROUND

In recent years, SSDs (Solid State Drives) have been proposed as data storage apparatuses. The SSD uses a NAND flash memory (hereinafter sometimes simply referred to as a flash memory) that is a rewritable nonvolatile memory. An example of the NAND flash memory is a three-dimensional stack memory (BiCS: Bit Cost Scalable) formed by stacking layers on a semiconductor substrate in a perpendicular direction and processing the layers at a time.

BRIEF DESCRIPTION OF THE DRAWINGS

FIG. 4 is a perspective view depicting the memory cell array according to the first embodiment;

FIG. 5 is a cross-sectional view depicting the memory cell array according to the first embodiment;

FIG. 6 is a diagram depicting an example of a fixation failure string position information table according to the first embodiment;

FIG. 7 is a diagram depicting an example of an address association table according to the first embodiment;

FIG. 8 is a flowchart depicting a writing operation in the memory system according to the first embodiment;

FIG. 9 is a flowchart depicting a reading operation in the memory system according to the first embodiment;

FIG. 10 is a diagram depicting an example of a command sequence in a case where no fixation failure string is found at the time of access according to the first embodiment;

FIG. 11 is a diagram depicting an example of a command sequence in a case where a fixation failure string is found at the time of access according to the first embodiment;

FIG. 15 is a flowchart depicting a testing operation before product shipment of the memory system according to the second embodiment;

FIG. 16 is a flowchart depicting a testing operation after product shipment of the memory system according to the second embodiment;

FIG. 17 is a diagram depicting a first compression method for fixation failure string position information in the memory system according to the second embodiment;

FIG. 18 is a diagram depicting a second compression method for fixation failure string position information in the memory system according to the second embodiment;

DETAILED DESCRIPTION

Figure 1:
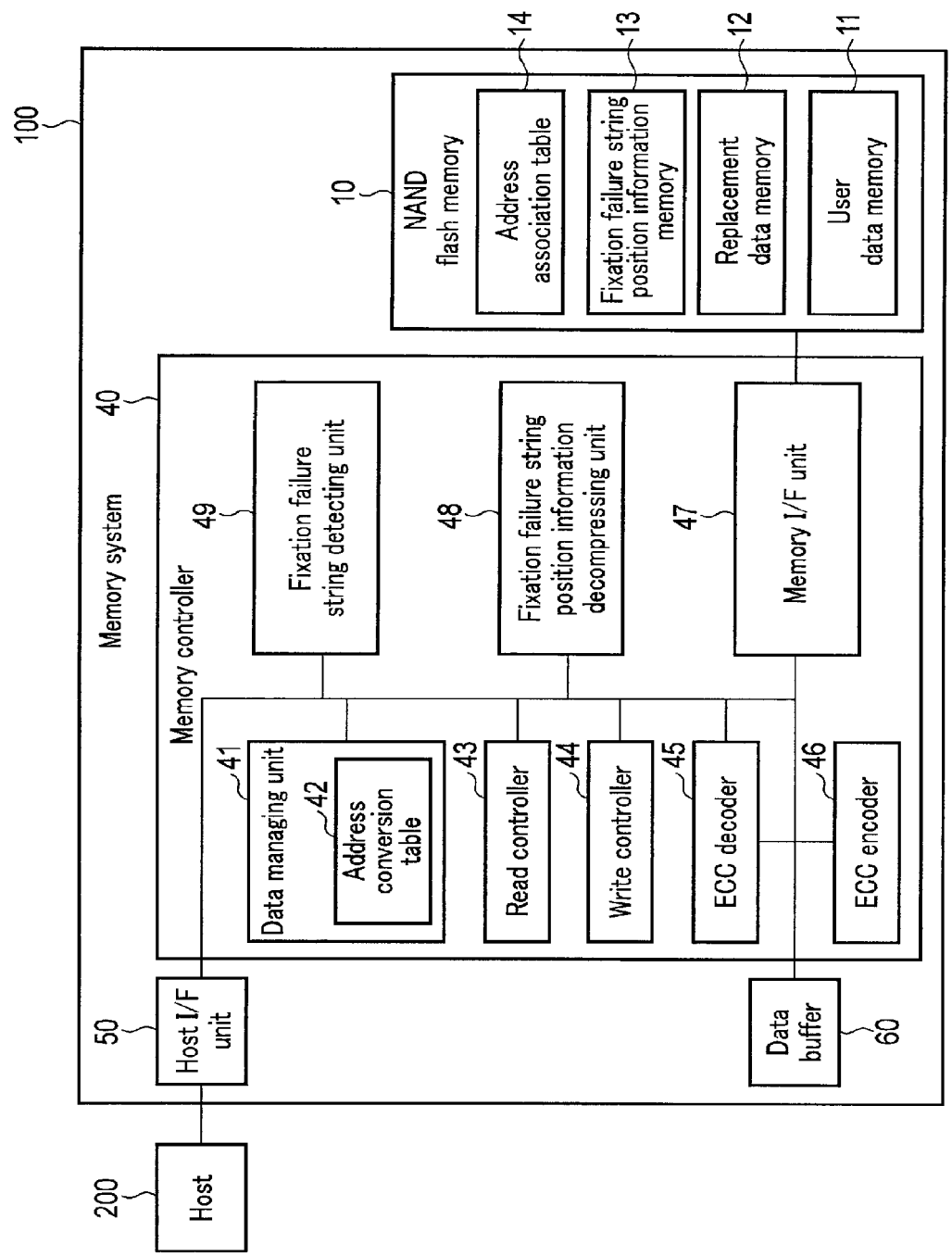
FIG. 1 is a block diagram of a memory system according to a first embodiment.

A BiCS has memory holes in a stacking direction, and memory strings (NAND strings) are formed along the memory holes. The BiCS has a larger storage capacity than planar NAND flash memories. Thus, the BiCS has a large number of failures (fixation failures).

In particular, the BiCS has initial failures referred to as memory hole failures. A memory hole failure results from filling of the inside of a memory hole with an insulating film or the like. A memory hole failure makes all memory cells providing the memory string defective. In the BiCS, such memory hole failures increase the number of fixation failures, making a correcting capability based on ECC insufficient. Thus, it is necessary to store information on fixation failure positions and reference the information to avoid performing a writing operation and a reading operation at the fixation failure positions.

In the present embodiment, the above-described problem is solved by storing fixation failure string position information in memory hole units (memory string units) and referencing the information to perform the writing operation and the reading operation.

In general, according to one embodiment, a memory system includes a memory system includes a nonvolatile memory including a first memory and a second memory, the first memory including memory strings, the memory strings including memory cell transistors connected in series; and a memory controller which compresses a failure string position information of the first memory, which stores the compressed failure string position information in the second memory, and which decompresses the compressed failure string position information stored in the second memory.

The present embodiment will be described below with reference to the drawings. Throughout the drawings, the same components are denoted by the same reference numerals. Furthermore, duplicate descriptions are given as needed.

First Embodiment

A memory system according to the first embodiment will be described below with reference to FIGS. 1 to 13. In the first embodiment, a fixation failure string position information decompressing unit 48 in a memory controller 40 decompresses fixation failure string position information in a fixation failure string position information memory 13 during a writing operation and during a reading operation. Based on the decompressed fixation failure string position information, the writing operation and the reading operation are performed on a NAND flash memory 10. This allows avoidance of performing the writing operation and the reading operation on a fixation failure string. The first embodiment will be described below in detail.

Configuration According to the First Embodiment

Using FIGS. 1 to 7, a configuration of the memory system according to the first embodiment will be described.

FIG. 1 is a block diagram of the memory system according to the first embodiment.

As depicted in FIG. 1, a memory system 100 includes the NAND flash memory 10, the memory controller 40, a host interface unit 50, and a data buffer 60.

The NAND flash memory 10 is, for example, a three-dimensional stack memory (BiCS). In this case, a case where the NAND flash memory 10 is a BiCS will be described by way of example.

Figure 2:
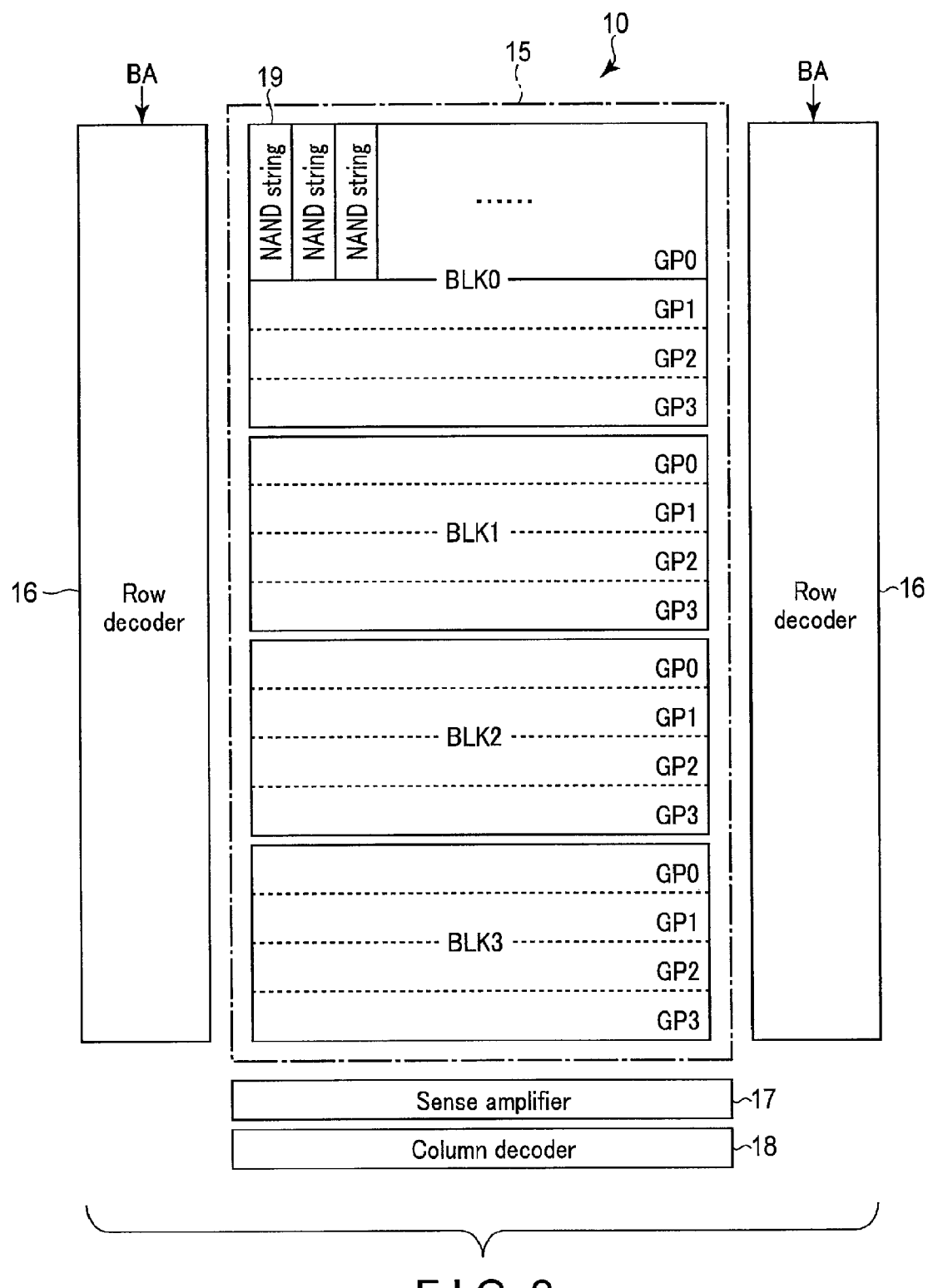
FIG. 2 is a schematic configuration diagram depicting a NAND flash memory according to the first embodiment.

FIG. 2 is a schematic configuration diagram depicting the NAND flash memory according to the first embodiment.

As depicted in FIG. 2, the NAND flash memory 10 includes a memory cell array 15, a row decoder 16, a sense amplifier 17, and a column decoder 18.

The memory cell array 15 includes a plurality of (four in the present example) blocks BLK (BLK0 to BLK3) each of which is a set of nonvolatile memory cells. The data in the same block BLK is erased at a time. Each block BLK includes a plurality of (four in the present example) string groups GP (GP0 to GP3) each of which is a set of NAND strings (memory strings) 19 each with memory cells connected together in series. The number of blocks in the memory cell array 15 is optional. The number of string groups in one block BLK is optional.

The row decoder 16 decodes a block address BA to select the corresponding block BLK.

The sense amplifier 17 senses and amplifies data read from a memory cell at the time of data reading. Furthermore, the sense amplifier 17 transfers write data to a memory cell at the time of data writing.

The column decoder 18 decodes a column address to select a column direction for the memory cell array 15.

A sequencer not depicted in the drawings controls operation of the whole NAND flash memory 10.

Figure 3:
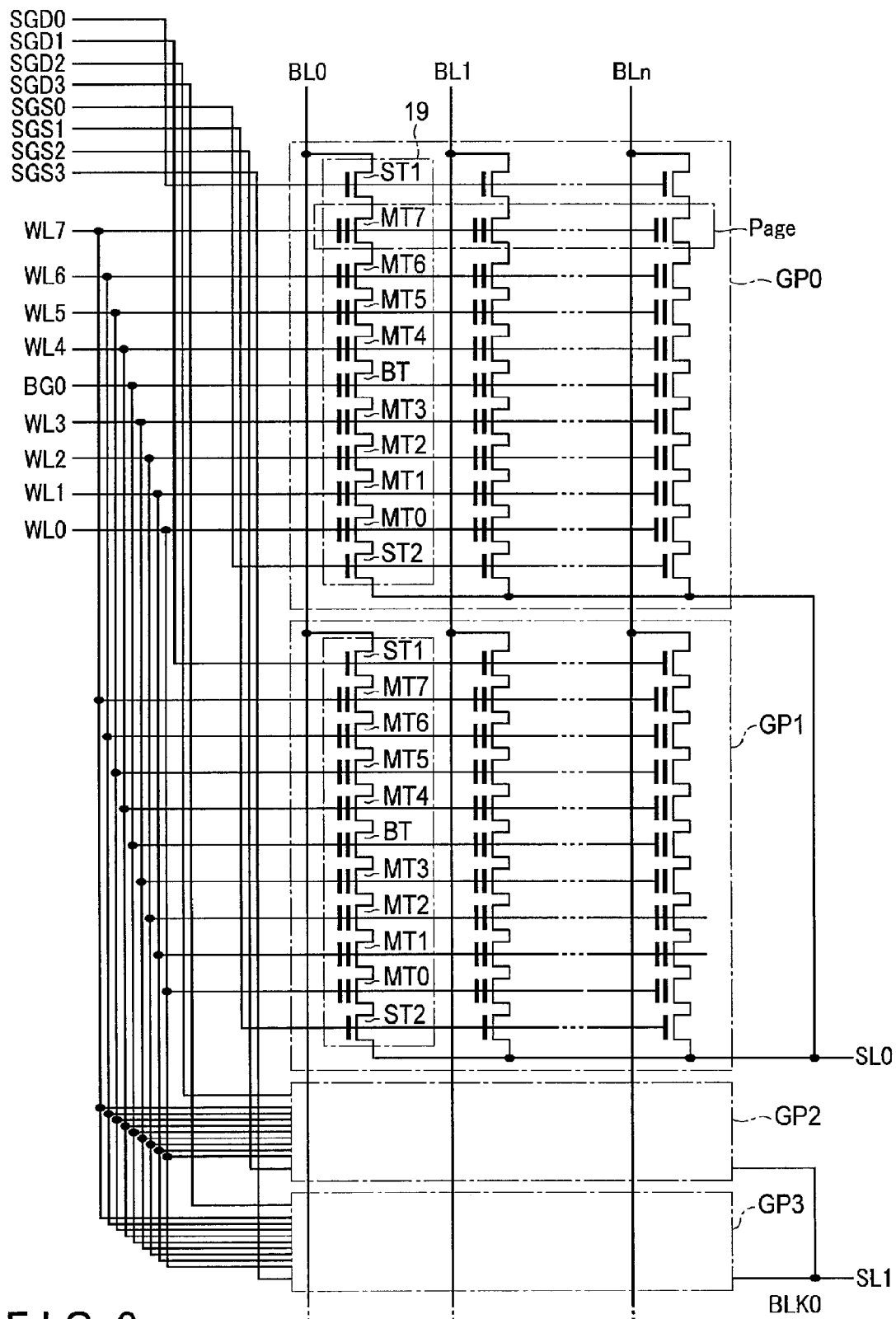
FIG. 3 is a circuit diagram of a memory cell array according to the first embodiment.

FIG. 3 is a circuit diagram depicting the memory cell array according to the first embodiment. FIG. 3 depicts a block BLK0, and blocks BLK1 to BLK4 have a configuration similar to the configuration of the block BLK0.

As depicted in FIG. 3, the block BLK0 includes, for example, four string groups GP (GP0 to GP3). Furthermore, each of the string groups GP includes n (n is a natural number) NAND strings 19.

Each of the NAND strings 19 includes, for example, eight memory cell transistors MT (MT0 to MT7), select transistors ST1 and ST2, and back gate transistor BT.

The memory cell transistor MT includes a stack gate including a control gate and a charge storage layer to hold data in a nonvolatile manner. The number of memory cell transistors MT is not limited to eight and may be 16, 32, 64, 128, or the like. No limitation is imposed on the number of memory cell transistors MT.

The back gate transistor BT includes a stack gate including a control gate and a charge storage layer similarly to the memory cell transistor MT. However, the back gate transistor BT is not intended to hold data but functions simply as a current path at the time of data writing, data reading, and data erasure.

The memory cell transistors MT and the back gate transistor BT are arranged to form, between the select transistors ST1 and ST2, a current path with the memory cell transistors MT and the back gate transistor BT connected together in series. The back gate transistor BT is provided between the memory cell transistors MT3 and MT4. The memory cell transistor MT7 at one end side of the series connection is connected to one end of the select transistor ST1. The memory cell transistor MT0 at the other end side is connected to one end of the current path in the select transistor ST2.

The select transistors ST1 in each of the string groups GP0 to GP3 are all connected to a corresponding one of select gate lines SGD0 to SGD3. The select transistors ST2 in each of the string groups GP0 to GP3 are all connected to a corresponding one of select gate lines SGS0 to SGS3. Control gates of the memory cell transistors MT0 to MT7 in the same block BLK0 are all connected to word lines WL0 to WL7, respectively. Control gates of the back gate transistors BT in the same block BLK0 are all connected to a back gate line BG (BG0 to BG3 in the blocks BLK0 to BLK3, respectively).

That is, for the word lines WL0 to WL7 and the back gate line BG, each group of lines in the same block BLK0 are all connected together among a plurality of string groups GP0 to GP3, whereas the select gate lines SGD and SGS, even in the same block BLK0, are independent of one another according to the string groups GP0 to GP3.

Furthermore, the other ends of the select transistors ST1 in those of the NAND strings 19 arranged in a matrix within the memory cell array 15 which are located in the same row are all connected to one bit line BL (BL0 to BLn; n is a natural number). That is, the bit line BL connects the NAND strings 10 in a plurality of the blocks BLK together. Additionally, the other ends of the select transistors ST2 are all connected to a source line SL. The source line connects the NAND strings 19, for example, in a plurality of the blocks together.

The data in the memory cell transistors MT in the same block BLK is erased at a time. In contrast, data reading and data writing are performed on a plurality of the memory cell transistors MT all connected to one word line WL in one string group GP in one block BLK. This unit is referred to as a "page".

Thus, the page includes some memory cells of a plurality of the NAND strings 19 in the same string group GP. In other words, the page covers a part of a plurality of the NAND strings 19 in the same string group GP. As described below in detail, in the present embodiment, when reading or writing is performed on any page, fixation failure string position information on the NAND strings 19 covered by the page is checked.

FIG. 4 is a perspective view depicting the memory cell array according to the first embodiment. FIG. 5 is a cross-sectional view depicting the memory cell array according to the first embodiment.

As depicted in FIG. 4 and FIG. 5, the memory cell array 15 is provided on a semiconductor substrate 20. The memory cell array 15 includes a back gate transistor layer L1, a memory cell transistor layer L2, a select transistor layer L3, and a wiring layer L4.

The back gate transistor layer L1 functions as the back gate transistor BT. The memory cell transistor layer L2 functions as the memory cell transistors MT0 to MT7 (NAND string 15). The select transistor layer L3 functions as the select transistors ST1 and ST2. The wiring layer L4 functions as the source line SL and the bit line BL.

The back gate transistor layer L1 is formed over the semiconductor substrate 20. The back gate transistor layer L1 includes a back gate conductive layer 21. The back gate conductive layer 21 is formed to spread in a first direction and a second direction both of which are parallel to the semiconductor substrate 20 (that is, the first direction and the second direction are orthogonal to a third direction in which the memory cells are stacked). The back gate conductive layer 21 is separated into pieces corresponding to the respective blocks BLK. The back gate conductive layer 21 is formed of, for example, polycrystalline silicon. The back gate conductive layer 21 functions as the back gate line BG.

Furthermore, as depicted in FIG. 5, the back gate conductive layer 21 includes a back gate hole 22. The back gate hole 22 is formed so as to be engraved in the back gate conductive layer 21. The back gate hole 22 is shaped generally like a rectangle in which the first direction is a longitudinal direction as viewed from an upper surface.

The memory cell transistor layer L2 is formed over the back gate conductive layer L1. The memory cell transistor layer L2 includes word line conductive layers 23a to 23d. The word line conductive layers 23a to 23d are stacked with an interlayer insulating layer (not depicted in the drawings) between the word line conductive layers. The word line conductive layers 23a to 23d are shaped like a stripe so as to have a predetermined pitch in the first direction and to extend in the second direction. The word line conductive layers 23a to 23d are formed of, for example, polycrystalline silicon. The word line conductive layer 23a functions as control gates (word lines WL3, WL4) for the memory cell transistors MT3, MT4. The word line conductive layer 23b functions as control gates (word lines WL2, WL5) for the memory cell transistors MT2, MT5. The word line conductive layer 23c functions as control gates (word lines WL1, WL6) for the memory cell transistors MT1, MT6. The word line conductive layer 23d functions as control gates (word lines WL0, WL7) for the memory cell transistors MT0, MT7.

Furthermore, as depicted in FIG. 5, the memory cell transistor layer L2 includes memory holes 24. The memory holes 24 are formed to penetrate the word line conductive layers 23a to 23d. The memory holes 24 are formed to align with the vicinities of ends of the back gate hole 22 in the first direction.

Moreover, as depicted in FIG. 5, the back gate transistor layer L1 and the memory cell transistor layer L2 include a block insulating layer 25a, a charge storage layer 25b, a tunnel insulating layer 25c, and a semiconductor layer 26. The semiconductor layer 26 functions as a channel for the NAND string 19.

The block insulating layer 25a is formed on inner surfaces of the back gate hole 22 and the memory holes 24. The charge storage layer 25b is formed on an inner surface of the block insulating layer 25a. The tunnel insulating layer 25c is formed on an inner surface of the charge storage layer 25b. The semiconductor layer 26 is formed on an inner surface of the tunnel insulating layer 25c. The semiconductor layer 26 is formed to fill the back gate hole 22 and the memory holes 24. The semiconductor layer 26 need not fill the back gate hole 22 and the memory holes 24 but a core material such as an insulating layer (not depicted in the drawings) may be formed inside the semiconductor layer 26.

The semiconductor layer 26 is U-shaped as viewed in the second direction. That is, the semiconductor layer 26 includes a pair of columnar portions 26a extending perpendicularly to a front surface of the semiconductor substrate 20 and a coupling portion 26b coupling lower ends of the columnar portions of the pair of columnar portions 26a.

The block insulating layer 25a and the tunnel insulating layer 25c are formed of, for example, silicon oxide ($SiO_2$).

The charge storage layer 25b is formed of, for example, silicon nitride (SiN). The semiconductor layer 26 is formed of polycrystalline silicon. The block insulating layer 25a, the charge storage layer 25b, the tunnel insulating layer 25c, and the semiconductor layer 26 form a MONOS transistor functioning as a memory transistor MT.

In other words, the back gate transistor layer L1 is configured such that the tunnel insulating layer 25c surrounds the coupling portion 26b. The charge storage layer 25b is formed to surround the tunnel insulating layer 25c. The block insulating layer 25a is formed to surround the charge storage layer 25b. Thus, the back gate conductive layer 21 is formed to surround the coupling portion 26b, the tunnel insulating layer 25c, the charge storage layer 25b, and the block insulating layer 25a.

Furthermore, In other words, the memory cell transistor layer L2 is configured to surround the columnar portion 26a. The charge storage layer 25b is formed to surround the tunnel insulating layer 25c. The block insulating layer 25a is formed to surround the charge storage layer 25b. Thus, the word line conductive layers 23a to 23d are formed to surround the columnar portion 26a, the tunnel insulating layer 25c, the charge storage layer 25b, and the block insulating layer 25a.

As depicted in FIG. 4 and FIG. 5, the select transistor layer L3 is formed over the memory cell transistor layer L2. The select transistor layer L3 includes a conductive layer 27a and a conductive layer 27b. The conductive layer 27a and the conductive layer 27b are shaped like a stripe so as to have a predetermined pitch in the first direction and to extend in the second direction. The conductive layer 27a and the conductive layer 27b are alternately arranged in the first direction. Thus, the conductive layer 27a is formed over one of the columnar portions of the pair of columnar portions 26a. The conductive layer 27b is formed over the other of the columnar portions 26a.

The conductive layers 27a, 27b are formed of polycrystalline silicon. The conductive layer 27a functions as a gate (select gate line SGS) of the select transistor ST2. The conductive layer 27b functions as a gate (select gate line SGD) of the select transistor ST1.

As depicted in FIG. 5, the select transistor layer L3 has holes 28a, 28b. The hole 28a penetrates the conductive layer 27a. The hole 28b penetrates the conductive layer 27b. Furthermore, the holes 28a, 28b align with the respective memory holes 24.

As depicted in FIG. 5, the select transistor layer L3 includes gate insulating layers 29a, 29b and semiconductor layers 30a, 30b. The gate insulating layer 29a is formed on an inner layer of the hole 28a. The gate insulating layer 29b is formed on an inner layer of the hole 28b. The semiconductor layer 30a is formed on an inner surface of the gate insulating layer 29a. The semiconductor layer 30b is formed on an inner surface of the gate insulating layer 29b. The semiconductor layers 30a, 30b are shaped like columns extending perpendicularly to the front surface of the semiconductor substrate 20.

The gate insulating layers 29a and 29b are formed of, for example, silicon oxide ($SiO_2$). The semiconductor layers 30a and 30b formed of, for example, polycrystalline silicon.

In other words, the select transistor layer L3 is configured to surround the columnar semiconductor layer 30a. The conductive layer 27a is formed to surround the gate insulating layer 29a and the semiconductor layer 30a. The gate insulating layer 29b is formed to surround the columnar semiconductor layer 30b. The conductive layer 27b is formed to surround the gate insulating layer 29b and the semiconductor layer 30b.

As depicted in FIG. 4 and FIG. 5, the wiring layer L4 is formed over the select transistor layer L3. The wiring layer L4 includes a source line layer 31, a plug layer 32, and a bit line layer 33.

The source line layer 31 is shaped like a plate extending in the second direction. The source line layer 31 is formed in contact with an upper surface of the semiconductor layer 27a. The plug layer 32 is formed in contact with an upper surface of the semiconductor layer 27b and so as to extend perpendicularly to the front surface of the semiconductor substrate 20. The bit line layer 33 is shaped like a stripe so as to have a predetermined pitch in the second direction and to extend in the first direction. The bit line layer 33 is formed in contact with an upper surface of the plug layer 32. The source line layer 31, the plug layer 32, and the bit line layer 33 are formed of, for example, tungsten (W). The source line layer 31 functions as the source line depicted in FIG. 3. The bit line layer 33 functions as the bit line BL.

As depicted in FIG. 1, the NAND flash memory 10, including a BiCS, includes a user data memory 11, a replacement data memory 12, fixation failure string position information memory 13, and an address association table 14.

The user data memory 11 stores user data transferred by a host 200.

The replacement data memory 12 stores, instead of the user data memory 11, data otherwise written to a fixation failure string in the user data memory 11. That is, the replacement data memory 12 includes a string that replaces the fixation failure string in the user data memory 11. The replacement data memory 12 is, for example, a part of a redundant area (redundancy).

The fixation failure string position information memory 13 stores fixation failure string position information of the user data memory 11. The fixation failure string refers to a string (memory hole) in which all the cells are disabled by a memory hole failure. The fixation failure string position information is stored in the fixation failure string position information memory 13 as a table (fixation failure string position information table). In the first embodiment, the fixation failure string position information is a table indicating whether all the strings are normal or defective.

FIG. 6 is a diagram depicting an example of the fixation failure string position information table according to the first embodiment. As depicted in FIG. 6, the fixation failure string position information table contains information indicating whether all the strings (any of the strings STR in any of the string groups GP in any of the blocks BLK) are defective or normal.

Thus, the fixation failure string position information memory 13 may have a capacity sufficient to store the fixation failure string position information for each string. That is, the fixation failure string position information memory 13 can store one string as 1 bit, and may thus have a storage capacity equivalent to a number of bits corresponding to the number of strings.

As depicted in FIG. 1, the address association table 14 is a table that associates addresses in the user data memory 11 with addresses in the fixation failure string position information memory 13. Referencing the table allows only the fixation failure string position information corresponding to an access unit to be read.

FIG. 7 is a diagram depicting an example of the address association table according to the first embodiment. The example is illustrated in which the access unit is a page unit.

As depicted in FIG. 7, the address association table 14 indicates page addresses in the user data memory 11, which are access units, and corresponding string addresses (fixation failure string position information) in the fixation failure string position information memory 13.

As described above, a memory hole failure disables all the memory cells in that memory hole (memory string). Thus, when accesses are performed in page units, the fixation failure string position information on all the memory strings covered by the page is needed. Therefore, in the address association table 14 depicted in FIG. 7, each page address is associated with the string addresses covered by the page address. For example, BLK0, GP0, PAGE0 to BLK0, GP0, PAGE3 each correspond to BLK0, GP0, STR0 to BLK0, GP0, STR3. This is because BLK0, GP0, PAGE0 to BLK0, GP0, PAGE3 each cover BLK0, GP0, STR0 to BLK0, GP0, STR3.

As depicted in FIG. 1, the host interface unit 50 controls transfer of data, commands, and addresses between the host 200 and the memory 100. In this regard, the host 200 is, for example, a computer including an interface compliant with SATA (Serial Advanced Technology Attachment) or a PCIe standard. The host interface unit 50 stores data (write data or the like) transferred by the host 200 in the data buffer 60. Furthermore, the host interface unit 50 transfers commands and addresses transferred by the host 200 to the memory controller 40.

The data buffer 60 is, for example, a buffer memory including a DRAM (Dynamic Random Access Memory). The data buffer 60 is not limited to the DRAM but may be any other volatile random access memory such as a SRAM (Static Random Access Memory). Furthermore, the data buffer 60 may be a nonvolatile random access memory such as an MRAM (Magnetoresistive Random Access Memory) or an FeRAM (Ferroelectric Random Access Memory). The data buffer 60 temporarily stores write data (user data) transferred by the host 200.

The memory controller 40 controls the NAND flash memory 10 in accordance with commands and addresses from the host. The memory controller 40 includes a data managing unit 41, a read controller 43, a write controller 44, an ECC decoder 45, an ECC encoder 46, a memory interface unit 47, a fixation failure string position information decompressing unit 48, and a fixation failure string detecting unit 49.

The data managing unit 41 holds data on data management in the memory system 100. data managing unit 41 includes, for example, an address conversion table 42. The address conversion table 42 includes a logical-physical conversion table. The logical-physical conversion table is a table that associates a logical address from the host 200 with a physical address in the NAND flash memory 10.

The ECC encoder 46 codes user data in the data buffer 60 to generate a code word. The code word includes data and a parity.

The ECC decoder 45 acquires, via the memory interface unit 47, a code word read from the NAND flash memory 10, and decodes the code word acquired. Upon failing to correct an error during decoding, the ECC decoder 45 notifies the read control unit 43 of a read error.

The write controller 44 performs the writing operation on the NAND flash memory 10 in accordance with a write command and a write address from the host 200. The write controller 44 assigns the logical address of the data to be written to a physical address in the NAND flash memory 10, and records the corresponding mapping in the data managing unit 41. When a specified string address corresponds to a fixation failure string, the write controller 44 replaces the string address with a redundant string address in the replacement data memory 12. Then, the write controller 44 writes the data to the redundant string address in the replacement data memory 12. On the other hand, when the specified string address is a normal string, the write controller 44 writes the data to the user data memory 11 in accordance with the specified string address.

The read controller 43 performs the reading operation on the NAND flash memory 10 in accordance with a read command and a read address from the host 200. The read controller 43 acquires, from the data managing unit 41, a physical address in the NAND flash memory 10 which corresponds to a logical address from the host 200, and notifies the memory interface unit 47 of the address acquired. When a specified string address is a fixation failure string, the read controller 43 reads data from a corresponding redundant string address in the replacement data memory 12. On the other hand, when the specified string address is a normal string, the read controller 43 reads data from the user data memory 11 in accordance with the specified string address. The read data is transmitted to the host 200 via the ECC encoder 46, the data buffer 60, and the host interface unit 50.

The fixation failure string position information decompressing unit 48 reads and decompresses fixation failure string position information from the fixation failure string position information memory 13 in the NAND flash memory 10. The fixation failure string position information decompressing unit 48 reads and decompresses the fixation failure string position information from the fixation failure string position information memory 13 for each access unit in various operations, for example, for each page unit. The fixation failure string position information decompressing unit 48 includes a volatile storage region and is, for example, a SRAM.

The fixation failure string detecting unit 49 issues a dedicated test command to the NAND flash memory 10 during a testing operation after product shipment to detect an acquired fixation failure string in the NAND flash memory 10 (user data memory 11). The fixation failure string detecting unit 49 may not only detect the acquired fixation failure string but also detect an inherent fixation failure string acquired before product shipment. The write controller 44 stores the detected fixation failure string position information in the fixation failure string position information memory 13.

The memory interface unit 47 exchanges data with the NAND flash memory 10 to control writing operations and reading operations performed on the NAND flash memory 10.

The data managing unit 41, the read control unit 43, the write control unit 44, the ECC decoder 45, the ECC encoder 46, the memory interface unit 47, the fixation failure string position information decompressing unit 48, and the fixation failure string detecting unit 49 may be implemented as hardware or software or as a combination of hardware and software. Whether these functions are implemented as hardware or software depends on a specific embodiment or design constraint imposed on the whole system. Those skilled in the art may implement these functions using various methods, and determination of such implementation is included in the scope of the present invention.

Writing Operation and Reading Operation in the First Embodiment

The writing operation and the reading operation in the memory system according to the first embodiment will be described using FIGS. 8 to 10.

FIG. 8 is a flowchart illustrating the writing operation in the memory system according to the first embodiment.

As depicted in FIG. 8, first, in step S10, the write controller 44 specifies a write address. The write address corresponds to the access unit, for example, the page unit.

Then, in step S11, the fixation failure string position information decompressing unit 48 reads and decompresses fixation failure string position information from the fixation failure string position information memory 13. The fixation failure string position information is fixation failure information on strings corresponding to the write address and is decompressed in the access unit for the writing operation, for example, the page unit. Instead of being read and decompressed directly by the fixation failure string position information decompressing unit 48, the fixation failure string position information may be decompressed by the fixation failure string position information decompressing unit 48 after being read by the read controller 43.

Then, when, in step S12, a fixation failure string is found based on the fixation failure string position information, in step S13, the write controller 44 replaces a fixation failure string address included in the specified string addresses (string addresses in the page) in the user data memory 11 with a redundant string address in the replacement data memory 12. Then, the write controller 44 writes data to the redundant string address in the replacement data memory 12.

Thereafter, in step S14, the write controller 44 writes the data to normal string addresses included in the specified string addresses (string addresses in the page) in the user data memory 11. That is, the data is written to normal strings corresponding to all the strings other than the fixation failure string in the page which has been subjected to the replacement and writing in step S13.

As described above, in the page that is the write unit, when the writing to the fixation failure strings is performed, the fixation failure strings is replaced with the redundant strings and the data is written to the redundant strings. When the writing to the normal strings is performed, the data is directly written to the normal strings.

On the other hand, when, in step S12, no fixation failure string is detected based on the fixation failure string position information, then in step S14, the write controller 44 writes the data to all the specified string addresses. That is, since all the strings in the page are normal, the data is written to all the strings in the page.

FIG. 9 is a flowchart illustrating the reading operation in the memory system according to the first embodiment.

As depicted in FIG. 9, first, in step S20, the read controller 43 specifies a read address. The read address corresponds to the access unit, for example, the page unit.

Then, in step S21, the fixation failure string position information decompressing unit 48 reads and decompresses fixation failure string position information from the fixation failure string position information memory 13. The fixation failure string position information is fixation failure information on strings corresponding to the read address and is decompressed in the access unit for the reading operation, for example, the page unit. Instead of being read and decompressed directly by the fixation failure string position information decompressing unit 48, the fixation failure string position information may be decompressed by the fixation failure string position information decompressing unit 48 after being read by the read controller 43.

Then, when, in step S22, a fixation failure string is detected based on the fixation failure string position information, in step S23, the read controller 43 reads data from a redundant string address in the replacement data memory 12 which corresponds to a fixation failure string address included in the specified string addresses (string addresses in the page) in the user data memory 11.

Thereafter, in step S24, the read controller 43 reads the data from normal string addresses included in the specified string addresses (string addresses in the page) in the user data memory 11. That is, the data is read from normal strings corresponding to all the strings other than the fixation failure string in the page which has been subjected to the reading in step S23.

As described above, in the page that is the read unit, when the reading from the fixation failure strings is performed, the data is read from the redundant strings. When the reading from the normal strings is performed, the data is directly read from the normal strings.

On the other hand, when, in step S22, no fixation failure string is detected based on the fixation failure string position information, then in step S24, the read controller 43 reads data from all the specified string addresses in the user data memory 11. That is, since all the strings in the page are normal, data is read from all the strings in the page.

The decompression of the fixation failure string position information in the above-described writing operation and reading operation will be more specifically described.

First, the fixation failure string position information decompressing unit 48 checks the string addresses corresponding to the page address targeted by the access (write/read) based on the address association table 14 depicted in FIG. 7. The fixation failure string position information decompressing unit 48 decompresses failure information on the string addresses based on the fixation failure string position information table depicted in FIG. 6.

For example, a case will be described where an access address for the user data memory 11 is BLK0, GP0, PAGE0. The fixation failure string position information decompressing unit 48 confirms that the address BLK0, GP0, PAGE0 corresponds to string addresses BLK0, GP0, STR0 to BLK0, GP0, STR3 based on FIG. 7. The fixation failure string position information decompressing unit 48 then decompresses fixation failure information on the string addresses BLK0, GP0, STR0 to BLK0, GP0, STR3 from the fixation failure string position information memory 13. As depicted in FIG. 6, the string address BLK0, GP0, STR0 is normal, the string address BLK0, GP0, STR1 is normal, and the string address BLK0, GP0, STR2 is defective.

Thereafter, STR2, which is a fixation failure string, is accessed by the redundant string in the replacement data memory 12. On the other hand, STR1 and STR2, which are normal strings, are accessed directly by the user data memory 11.

FIG. 10 is a diagram depicting an example of a command sequence in a case where no fixation failure string is found at the time of access according to the first embodiment. FIG. 11 is a diagram depicting an example of a command sequence in a case where a fixation failure string is found at the time of access according to the first embodiment. In this regard, exchange of commands, data, and addresses between the memory controller 40 and the NAND flash memory 10 during the writing operation will be described.

As depicted in FIG. 10 and FIG. 11, first, the memory controller 40 issues a read command 70H and then a table address TABLE. The read command 70H and the table address TABLE are stored in a register in the NAND flash memory 10 which is not depicted in the drawings. Consequently, the memory controller 40 reads fixation failure string position information (INF) from the fixation failure string position information memory 13.

With no fixation failure string found, the memory controller 40 issues a write command 80H and then a page address PAGE as depicted in FIG. 10. Thereafter, the memory controller 40 outputs data DATA. Finally, the memory controller 40 issues an execution command 10H. In response to the execution command 10H, the NAND flash memory 10 starts the writing operation. In the present example, since no fixation failure string is found, the data is written directly to the strings with the specified page address PAGE.

On the other hand, when a fixation failure string is found, the memory controller 40 issues the write command 80H and then the page address PAGE as depicted in FIG. 11. Thereafter, the memory controller 40 outputs the data DATA. Subsequently, the memory controller 40 issues a special command XXH and a string address STR in order. Finally, the memory controller 40 issues the execution command 10H. In response to the execution command 10H, the NAND flash memory 10 starts the writing operation.

The special command XXH in the present example is a command that prevents writing from being performed at the string address STR issued next to the special command XXH. The string address STR is a fixation failure string address. Thus, in the present example, the data is written directly to the normal strings with the specified page address PAGE. On the other hand, the data is not written to the fixation failure string but to the corresponding redundant string.

Testing Operation in the First Embodiment

A testing operation in the memory system according to the first embodiment will be described using FIGS. 12 and 13. In this regard, the testing operation is an operation starting with detection of a fixation failure string and ending with storage of information on the fixation failure string.

Figure 12:
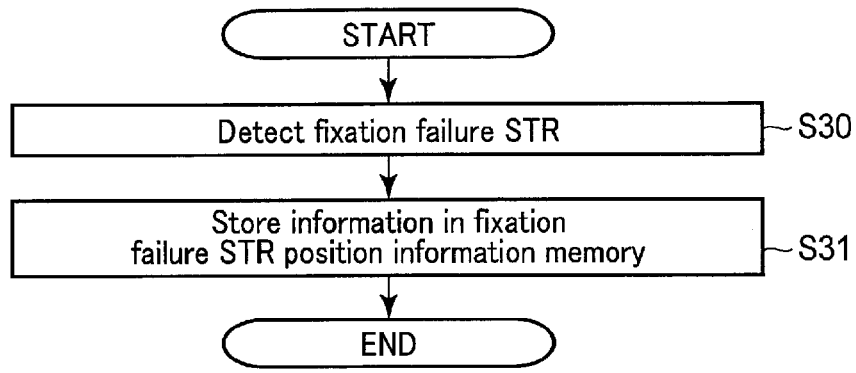
FIG. 12 is a flowchart depicting a testing operation before product shipment in the memory system according to the first embodiment.

FIG. 12 is a flowchart illustrating a testing operation before product shipment in the memory system according to the memory system according to the first embodiment. The testing operation before product shipment tests for inherent fixation failure strings. The inherent fixation failure string results from a memory hole failure in manufacturing steps or the like.

As depicted in FIG. 12, in the testing operation before product shipment, first, a fixation failure string is detected in the NAND flash memory 10 (user data memory 11) in step S30. Thereafter, in step S31, the write controller 44 stores fixation failure string position information in the fixation failure string position information memory 13.

Figure 13:
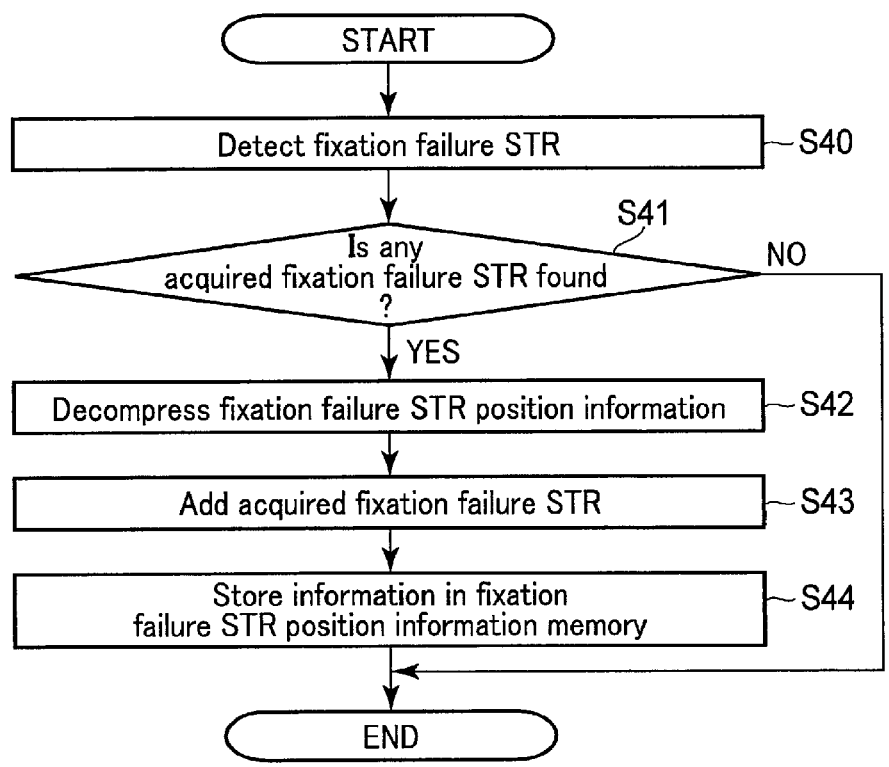
FIG. 13 is a flowchart depicting a testing operation after product shipment in the memory system according to the first embodiment.

FIG. 13 is a flowchart illustrating a testing operation after product shipment in the memory system according to the first embodiment. The testing operation after product shipment tests acquired fixation failure strings. The testing operation after product shipment is performed when the writing operation or the reading operation results in a failure. It is also preferable to perform only the testing operation in accordance with a dedicated command from the memory controller 40 at any time rather than at the time of the writing operation or the reading operation. The testing operation is automatically and periodically performed.

As depicted in FIG. 13, in the testing operation after product shipment, first, the fixation failure string detecting unit 49 detects an acquired fixation failure string in the NAND flash memory 10 (user data memory 11) in step S40.

The acquired fixation failure string is detected by, for example, writing "1" to all the memory cells in each string and then performing reading on all the memory cells. When "0" is read from any memory cell, a string including the memory cell is determined to be a fixation failure string.

Then, when, in step S41, an acquired fixation failure string is found, in step S42, the fixation failure string position information decompressing unit 48 reads and decompresses fixation failure string position information from the fixation failure string position information memory 13. The fixation failure string position information is fixation failure information on strings in the access unit, for example, the page unit. Furthermore, the fixation failure string position information is failure information including inherent fixation failure string position information. Instead of being read and decompressed directly by the fixation failure string position information decompressing unit 48, the fixation failure string position information may be decompressed by the fixation failure string position information decompressing unit 48 after being read by the read controller 43.

Then, in step S43, the acquired fixation failure string position information is added to (merged with) the decompressed fixation failure string position information. Therefore, the fixation failure string position information includes the inherent fixation failure string position information and the acquired fixation failure string position information.

Thereafter, in step S44, the write controller 44 stores the fixation failure string position information in the fixation failure string position information memory 13.

On the other hand, when, in step S41, no acquired fixation failure string is found, the testing operation ends.

The testing operation before product shipment may be performed by execution of testing firmware by an arithmetic processing apparatus which is not depicted in the drawings and which is built in the memory controller 40.

In this case, the testing firmware is, for example, saved in the NAND flash memory 10. Then, the arithmetic processing apparatus loads the testing firmware into the data buffer to execute the firmware loaded in the data buffer.

The memory system 100 acquires the testing firmware from a testing apparatus. The memory system 100 is connected to the testing apparatus via the host I/F unit 50. The memory controller 40 saves the testing firmware received from the testing apparatus in the NAND flash memory 10.

The testing firmware is, for example, saved in a server connected to the memory system via the Internet. The testing apparatus is connected to the server via the Internet so as to be able to communicate with the server. The testing firmware is downloaded into the testing apparatus through the Internet connection. The testing apparatus transmits the downloaded testing firmware to the memory system 100.

Alternatively, the testing firmware may be saved in, for example, an optical medium such as a DVD-ROM or a nonvolatile storage medium such as a USB memory. The testing apparatus may be connected to the nonvolatile storage medium to acquire the testing firmware from the nonvolatile storage medium and transmit the testing firmware acquired to the memory system 100.

Effects of the First Embodiment

According to the first embodiment, the memory controller 40 includes the fixation failure string position information decompressing unit 48. In the writing operation and the reading operation, the fixation failure string position information decompressing unit 48 decompresses the fixation failure string position information from the fixation failure string position information memory 13. Based on the decompressed fixation failure string position information, the writing operation and the reading operation are performed on the NAND flash memory 10. This enables determination of whether each string is defective or normal to avoid performing the writing operation and the reading operation on the fixation failure string.

In this regard, a method in a comparative example involves, for example, decompressing all of the fixation failure string position information in the NAND flash memory into a decompression unit of the memory controller at the time of power-on reading, and performing the writing operation and the reading operation with reference to the fixation failure string position information. However, the BiCS has a large storage capacity, and thus, a large storage capacity is needed for the fixation failure string position information. Thus, when all of the fixation failure string position information is decompressed into the decompression unit, the decompression unit also needs to have an increased storage capacity.

In contrast, in the first embodiment, the fixation failure string position information decompressing unit 48 reads and decompresses, in the writing operation and the reading operation, the fixation failure string position information from the fixation failure string position information memory 13 for each access unit for the operation (for example, for each page unit). That is, the fixation failure string position information decompressing unit 48 need not decompress all of the fixation failure string position information in the fixation failure string position information memory 13 at a time. Therefore, the fixation failure string position information decompressing unit 48 may have a capacity sufficient to decompress only the fixation failure string position information in the access unit. This enables a reduction in the capacity of the fixation failure string position information decompressing unit 48.

Furthermore, in the first embodiment, the memory controller 40 includes the fixation failure string detecting unit 49. The fixation failure string detecting unit 49 detects acquired fixation failure strings. Consequently, even when a fixation failure string is acquired after product shipment, this can be detected.

Second Embodiment

When a table indicating whether each of all strings is normal or defective is stored as the fixation failure string position information, an enormous storage capacity is needed for the fixation failure string position information. To avoid this, a method is available which involves storing, as the fixation failure string position information, only the positions of fixation failure strings instead of the information of whether each of all strings is normal or defective. However, even in this method, an increased storage capacity of the NAND flash memory increases the number of fixation failure strings, resulting in an increased storage capacity for the fixation failure string position information.

A memory system according to a second embodiment will be described below using FIGS. 14 to 20. To deal with the above-described problem, a fixation failure string position information compressing unit 70 in the memory controller 40 compresses detected fixation failure string position information according to the second embodiment. Then, the fixation failure string position information memory 13 stores the compressed fixation failure string position information. This enables a reduction in the storage capacity of the fixation failure string position information memory 13. The second embodiment will be described in detail.

For the second embodiment, description of points similar to the corresponding points of the first embodiment is omitted, and mainly differences from the first embodiment will be described.

Configuration of the Second Embodiment

Figure 14:
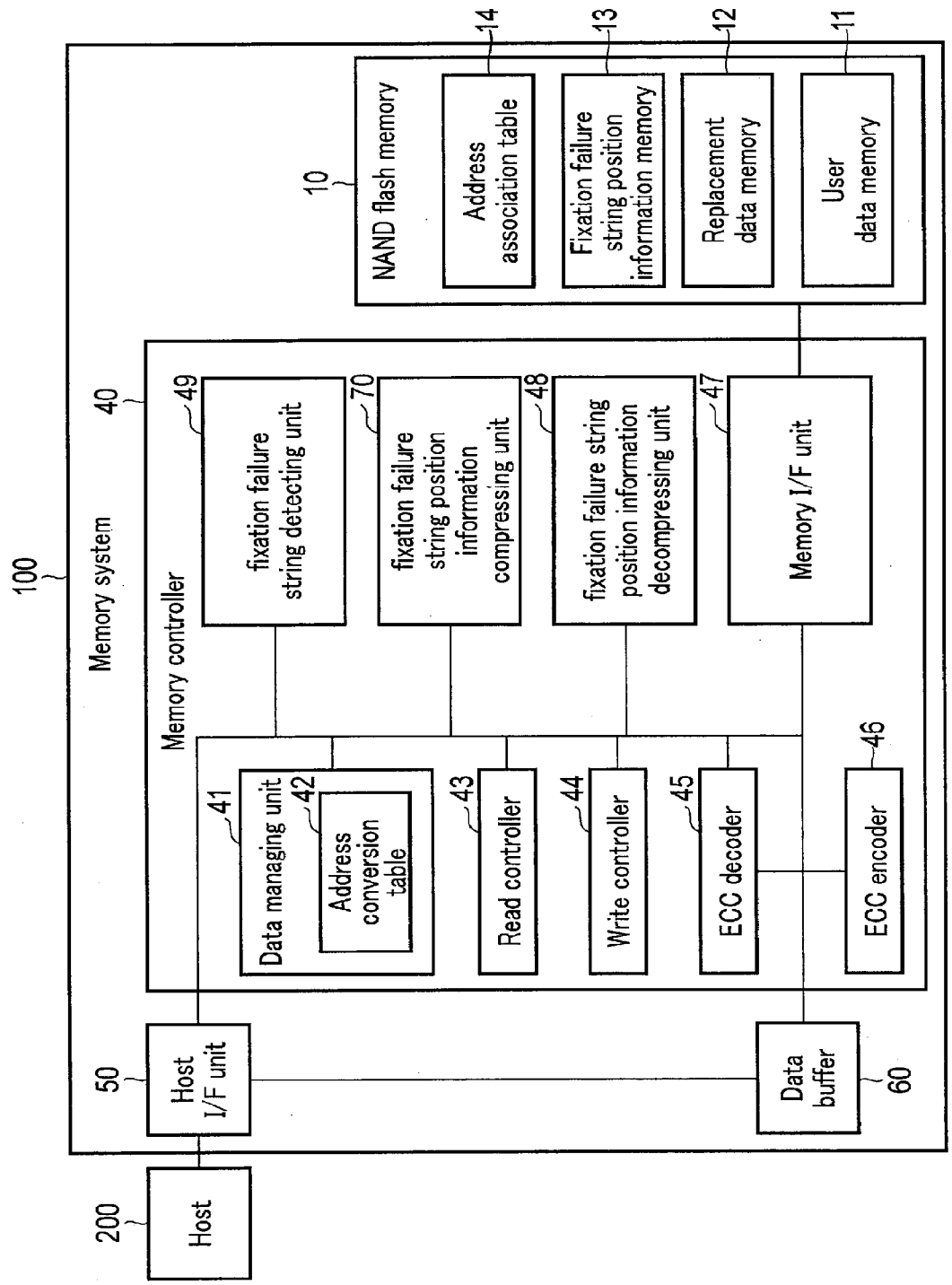
FIG. 14 is a block diagram of a memory system according to a second embodiment.

FIG. 14 is a block diagram of the memory system according to the second embodiment.

As depicted in FIG. 14, a difference of the second embodiment from the first embodiment is that the memory system 100 includes the fixation failure string position information compressing unit 70.

The fixation failure string position information compressing unit 70 compresses fixation failure string position information. Details of a compression method will be described below. In the second embodiment, the fixation failure string position information indicates only the position of a fixation failure string. The fixation failure string position information memory 13 in the NAND flash memory 10 stores compressed fixation failure string position information. Then, the fixation failure string position information decompressing unit 48 reads and decompresses the compressed fixation failure string position information from the fixation failure string position information memory 13 in the NAND flash memory 10.

Testing Operation in the Second Embodiment

A testing operation in the memory system according to the second embodiment will be described using FIG. 15 and FIG. 16.

FIG. 15 is a flowchart illustrating a testing operation before product shipment in the memory system according to the second embodiment.

As depicted in FIG. 15, in the testing operation before product shipment, first, a fixation failure string in the NAND flash memory 10 (user data memory 11) is detected in step S50. Then, in step S51, the fixation failure string position information compressing unit 70 compresses fixation failure string position information. At this time, the fixation failure string position information compressing unit 70 compresses the fixation failure string position information for each access unit (page unit). Thereafter, in step S52, the write controller 44 stores the compressed fixation failure string position information in the fixation failure string position information memory 13.

FIG. 16 is a flowchart illustrating a testing operation after product shipment in the memory system according to the second embodiment.

As depicted in FIG. 16, in the testing operation after product shipment, first, the fixation failure string detecting unit 49 detects an acquired fixation failure string in the NAND flash memory 10 (user data memory 11) in step S60.

Then, when, in step S61, an acquired fixation failure string is found, in step S62, the fixation failure string position information decompressing unit 48 reads and decompresses fixation failure string position information from the fixation failure string position information memory 13. The fixation failure string position information is fixation failure information on strings in the access unit, for example, the page unit. Furthermore, the fixation failure string position information is failure information including only the inherent fixation failure string position information. Instead of being read and decompressed directly by the fixation failure string position information decompressing unit 48, the fixation failure string position information may be decompressed by the fixation failure string position information decompressing unit 48 after being read by the read controller 43.

Then, in step S63, the acquired fixation failure string position information is added to (merged with) the decompressed fixation failure string position information. Therefore, the fixation failure string position information includes the inherent fixation failure string position information and the acquired fixation failure string position information.

Then, in step S64, the fixation failure string position information compressing unit 70 compresses the fixation failure string position information.

Thereafter, in step S65, the write controller 44 stores the fixation failure string position information in the fixation failure string position information memory 13.

On the other hand, when, in step S61, no acquired fixation failure string is found, the testing operation ends.

Compression Method for Fixed Defective String Position Information According to the Second Embodiment A compression method for fixation failure string position information in the memory system according to the second embodiment will be described using FIGS. 17 to 20. A first to a fourth compression methods will be described below. However, the compression method is not limited to these methods.

FIG. 17 is a diagram illustrating a first compression method for fixation failure string position information in the memory system according to the second embodiment. In the first compression method, when only the positions of fixation failure strings are stored, the distances between adjacent fixation failure strings are calculated, and the fixation failure string position information is compressed using the calculated distances. In this regard, the distance between the strings indicates the number of strings present between the strings. Furthermore, in the first compression method, all the distances between the fixation failure strings are expressed using, for example, 8 bits. The 8 bits are the number of bits that allows the largest one of the calculated distances between the fixation failure strings to be expressed.

More specifically, with the position of leading string used a reference, the distance from the leading string to the first fixation failure string is stored as depicted in FIG. 17. Then, the distance from the first fixation failure string to the next fixation failure string (second fixation failure string) is stored. Moreover, the distance from the second fixation failure string to the next fixation failure string (third fixation failure string) is stored. In this manner, the distances between the adjacent fixation failure strings from the first fixation failure string to the last fixation failure string are stored in order.

The amount of compression based on the above-described compression method will be described. In this case, one string is hereinafter assumed to be 1 bit for convenience.

For example, fixation failure strings present are approximately 1% of the total storage capacity. Thus, when the total storage capacity is assumed to be 8 kB, all the fixation failure strings are expressed as 8×1024×8×0.01=655 bits. Since approximately 1 bit of fixation failure string is present for every 100 bits, the maximum value of the distance between fixation failure strings can be expressed using a value up to approximately 256 (8 bits). That is, position information on one fixation failure string can be expressed using 8 bits. Therefore, position information on all the fixation failure strings can be expressed using 655×8=5240 bits=655 B.

On the other hand, if the fixation failure string position information is not compressed (when the fixation failure string position information is expressed simply by using the addresses of fixation failure strings), when the total storage capacity is assumed to be 8 kB, the address of one fixation failure string can be expressed using 16 bits. Thus, to express the position information on all the fixation failure strings, a capacity of 655×16=10480 bits=1310 B is needed.

Therefore, the first compression method allows the fixation failure string position information to be expressed using approximately half of the capacity needed when the addresses of fixation failure strings are simply expressed.

FIG. 18 is a diagram illustrating a second compression method for fixation failure string position information in the memory system according to the second embodiment.

In the first compression method, all the distances between adjacent fixation failure strings are expressed using a value up to 256 (8 bits). The value of 256 (8 bits) is the number of bits that allows the maximum one of the calculated distances between the fixation failure strings to be expressed. Thus, for example, if the distance between the fixation failure strings significantly varies or if the maximum distance between the fixation failure strings is significantly large, an excessive number of bits are used to express a short distance (for example, the minimum distance) between the fixation failure strings, reducing a compression rate.

As depicted in FIG. 18, in the second compression method, all the distances between the fixation failure strings are using, for example, 6 bits. The 6 bits allow expression of, for example, up to 90% of the calculated distances between the fixation failure strings as counted from a low-level distance (minimum distance). In other words, the 6 bits do not allow expression of 10% of the distances as counted from a high-level distance (maximum distance). Thus, as illustrated, with a distance of 6 bits or more present, a string positioned at the maximum distance that can be expressed using 6 bits is treated as a dummy fixation failure string. Then, the distance from the dummy fixation failure string to the next fixation failure string is stored.

The second compression method allows the distances between all the fixation failure strings to be expressed using a relatively small number of bits. Thus, the use of an excessive number of bits can be suppressed in expressing a short distance.

Figure 19:
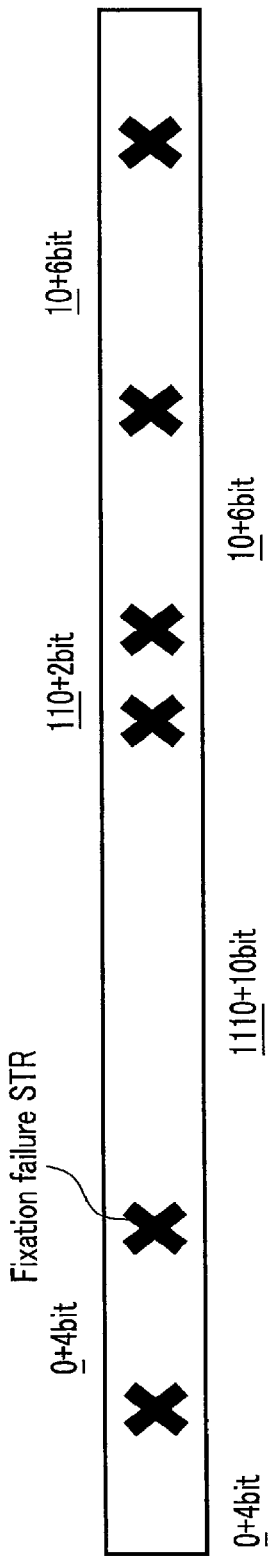
FIG. 19 is a diagram depicting a third compression method for fixation failure string position information in the memory system according to the second embodiment.

FIG. 19 is a diagram illustrating the third compression method for fixation failure string position information in the memory system according to the second embodiment.

As depicted in FIG. 19, in the third compression method, all the distances between the fixation failure strings are expressed using the minimum number of bits that allows the distances to be expressed and flags according to the number of bits. The flag is a Huffman code. That is, the flag is determined by the frequency of the number of bits and set to have a value decreasing with increasing frequency. For example, when the frequency of the number of bits is in an order of 4 bits, 6 bits, 2 bits, and 10 bits, flags added to the respective numbers of bits are 0, 10, 110, and 1110. The distance between the fixation failure strings is expressed using the flag, that is, by the flag+the minimum number of bits. For example, a distance that can be expressed using 4 bits is expressed as 0+4 bits.

The third compression method allows the compression rate to be improved when the maximum distance between the fixation failure strings is significantly large compared to the average distance between the fixation failure strings.

Figure 20:
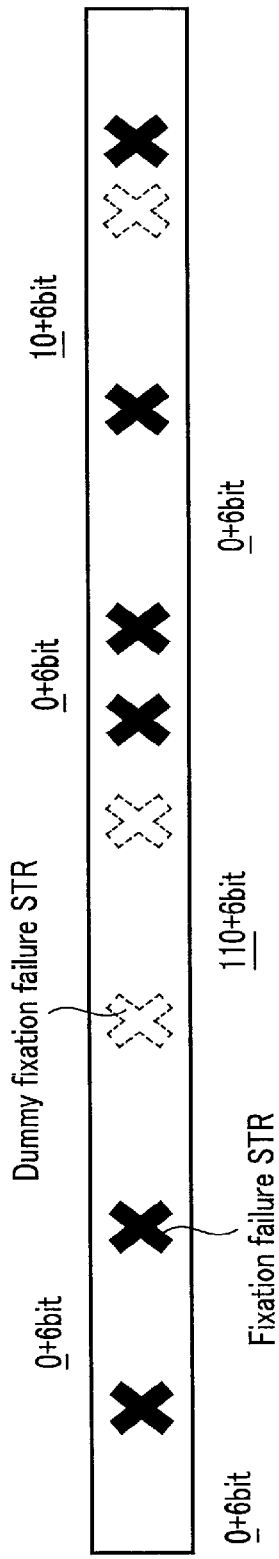
FIG. 20 is a diagram depicting a fourth compression method for fixation failure string position information in the memory system according to the second embodiment.

FIG. 20 is a diagram illustrating the fourth compression method for fixation failure string position information in the memory system according to the second embodiment.

As depicted in FIG. 20, in the fourth compression method, all the distances between the fixation failure strings are expressed using, for example, 6 bits and flags. The 6 bits allow expression of, for example, up to 90% of the distances between the fixation failure strings as counted from the low-level distance. Furthermore, when the 6 bits are defined as one block, the flag is determined by the number of blocks present between a fixation failure string and the next fixation failure string. For example, when the number of blocks present between a fixation failure string and the next fixation failure string can be expressed using 6 bits (in the case of one block), the flag is 0. When the number of blocks can be expressed using 6 bits+6 bits (in the case of two blocks), the flag is 10. When the number of blocks can be expressed using 6 bits+6 bits+6 bits (in the case of three blocks), the flag is 110. The distance between the fixation failure strings is expressed using the flag, that is, by the flag+6 bits. The distance of one block is expressed by 0+6 bits.

Effects of the Second Embodiment

In the second embodiment, the memory controller 40 includes the fixation failure string position information compressing unit 70. The fixation failure string position information compressing unit 70 compresses detected fixation failure string position information. The fixation failure string position information memory 13 stores the compressed fixation failure string position information. Consequently, the storage capacity of the fixation failure string position information memory 13 can be reduced.

Furthermore, in the second embodiment, the fixation failure string position information decompressing unit 48 decompresses the compressed fixation failure string position information from the fixation failure string position information memory 13. Thus, the capacity for the decompressed fixation failure string position information is reduced by the degree of the compression. Therefore, the storage capacity of the fixation failure string position information decompressing unit 48 can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a first memory and a second memory, the first memory including memory strings, the memory strings including memory cell transistors connected in series; and
   a memory controller which compresses a failure string position information of the first memory, which stores the compressed failure string position information in the second memory, and which decompresses the compressed failure string position information stored in the second memory, wherein the memory controller performs compression using distances between adjacent failure strings and expresses one of the distances with a first bit, the first bit being capable of representing a first distance of the distances and smaller than a second bit being capable of representing a maximum distance of the distances, and when the distance between the adjacent failure strings is larger than the first distance, the memory controller sets a string positioned at the first distance between the adjacent failure strings to be a dummy failure string.

2. The system of claim 1, wherein
the memory controller compresses the failure string position information for each access unit.

3. The system of claim 1, wherein
the memory controller decompresses the failure string position information for each access unit.

4. The system of claim 1, wherein
the nonvolatile memory further includes a third memory, in a writing operation, the memory controller decompresses the failure string position information on a writing target memory string in the first memory from the second memory, perform writing on the writing target memory string in the first memory when the writing target memory string in the first memory is normal, and replaces the writing target memory string in the first memory with a memory string in the third memory and performs writing on the replaced memory string in the third memory when the writing target memory string in the first memory is defective, and in a reading operation, the memory controller decompresses the failure string position information on a reading target memory string in the first memory from the second memory, performs reading on the reading target memory string in the first memory when the reading target memory string in the first memory is normal, and performs reading on a memory string in the third memory which corresponds to the reading target memory string in the first memory when the reading target memory string in the first memory is defective.

5. The system of claim 4, wherein
the memory controller performs the writing operation and the reading operation in page units, and decompresses the failure string position information on memory strings covered by the page.

6. The system of claim 1, wherein
the memory controller detects a failure string among the memory strings in the first memory, decompresses the compressed failure string position information stored in the second memory, merges the decompressed failure string position information with information of the detected failure string to update the failure string position information, compresses the updated failure string position information, and stores the compressed failure string position information in the second memory.

7. The system of claim 1, wherein
the distances are based on a number of strings between adjacent failure strings.

8. The system of claim 1, wherein
the memory controller expresses one of the distances with a first flag as well as the first bit, the first flag according to a number of blocks, each one of the blocks including the first bit.

9. A method for controlling a nonvolatile memory including memory strings, each of the memory strings including memory cell transistors connected in series, the method comprising:

compressing failure string position information in a first memory in the nonvolatile memory;

storing the compressed failure string position information in a second memory in the nonvolatile memory; and decompressing the compressed failure string position information stored in the second memory into a data buffer, wherein the compressing includes performing compression using distances between adjacent failure strings and expressing one of the distances with a first bit, the first bit being capable of representing a first distance of the distances and smaller than a second bit being capable of representing a maximum distance of the distances, and the compressing includes, when the distance between the adjacent failure strings is larger than the first distance, setting a string positioned at the first distance between the adjacent failure strings to be a dummy failure string.

10. The method of claim 9, wherein
the compressing comprises compressing the failure string position information for each access unit.

11. The system of claim 9, wherein
the decompressing comprises decompressing the failure string position information for each access unit.

12. The method of claim 9, further comprising:
in response to a data write request to the first memory, performing writing on a writing target memory string in the first memory when the writing target memory string in the first memory is normal, and replacing the writing target memory string in the first memory with a memory string in a third memory in the nonvolatile memory and performing writing on the replacing memory string in the third memory when the writing target memory string in the first memory is defective, and in response to a data read request from the first memory, decompressing the failure string position information on a reading target memory string in the first memory from the second memory, and performing reading on the reading target memory string in the first memory when the reading target memory string in the first memory is normal, and performing reading on a memory string in the third memory which corresponds to the reading target memory string in the first memory when the reading target memory string in the first memory is defective.

13. The method of claim 12, wherein
the writing and the reading is performed in page units, and the decompression includes decompressing the failure string position information on memory strings covered by the page.

14. The method of claim 9, further comprising:
detecting a failure string in the first memory;
decompressing the compressed failure string position information stored in the second memory;
updating the failure string position by merging the decompressed failure string position information with information of the detected failure string position information;
compressing the updated failure string position information; and
storing the compressed failure string position information in the second memory.

15. The method of claim 9, wherein
the distances are based on a number of strings between adjacent failure strings.

16. The method of claim 9, wherein
the compressing includes expressing one of the distances with a first flag as well as the first bit, the first flag according to a number of blocks, each one of the blocks including the first bit.

* * * * *